United States Patent
Suppelsa et al.

(10) Patent No.: US 6,229,097 B1
(45) Date of Patent: May 8, 2001

(54) SUBSTRATE HAVING TRIM WINDOW IN A C5 ARRAY

(75) Inventors: Anthony J. Suppelsa, Coral Springs; Richard J. Kolcz, Davie; Carl M. Thielk, Boca Raton; Branko Avanic, Miami, all of FL (US)

(73) Assignee: Motorola, Inc., Schaumburg, IL (US)

( * ) Notice: Subject to any disclaimer, the term of this patent is extended or adjusted under 35 U.S.C. 154(b) by 562 days.

(21) Appl. No.: 08/612,693

(22) Filed: Mar. 8, 1996

(51) Int. Cl.[7] ........................................ H05K 1/16
(52) U.S. Cl. ......................... 174/260; 338/195; 361/765; 174/250
(58) Field of Search .................... 174/250, 260, 174/261, 52.4; 338/195, 64; 361/779, 765, 774

(56) References Cited

U.S. PATENT DOCUMENTS

| | | | |
|---|---|---|---|
| 4,725,925 | * | 2/1988 | Tanaka et al. ........................ 361/774 |
| 5,122,620 | * | 6/1992 | Neumann et al. ............... 338/195 X |

* cited by examiner

*Primary Examiner*—Hyung Sub Sough
(74) *Attorney, Agent, or Firm*—Dale W. Dorinski

(57) ABSTRACT

A substrate 15 has an electrically adjustable trim pad 50 on the bottom side. A circuit pattern 18 resides on the top side, covered by an RF shield 20. The trim pad is located on the bottom side directly below the RF shield, and is electrically connected 52 to the circuit pattern. A number of surface mount connections 30, typically C5 solder bumps, are located on the bottom side, and surround the trim pad. The trim pad is trimmed after the RF shield is attached, thus providing more accurate tuning of the circuit on the top side.

15 Claims, 2 Drawing Sheets

SUBSTRATE HAVING TRIM WINDOW IN A C5 ARRAY

TECHNICAL FIELD

This invention relates in general to surface mount substrates, and more particularly to substrates having a trim window on the bottom side.

BACKGROUND

Hybrid microcircuits are commonly used in the electronics industry. Typically, each of these circuits is on a ceramic or printed circuit board (PCB) substrate and has active and/or passive components on one side. The hybrid microcircuits are typically attached to a mother board (main PC Board) by leads or by surface mount terminals.

Many microcircuits need to be precisely tuned or adjusted in order to operate at the proper parameters. Typically, this tuning process involves changing the value of a resistor or a capacitor by physically removing a portion of the resistor or capacitor. In the prior art, one way of doing this was by sand trimming thick film or thin film resistor that was printed on the circuit. When a small jet of sand is impinged upon the resister at high velocity, the sand particles are brayed away selected portions of the resistor, thus changing the resistance value. In an active tuning situation, the parameters of the circuit are measured while the resister is being trimmed and the process is terminated when the circuit parameters reach the desired values. This is an example of a closed loop feed back trimming system. Circuits that operate at or near radio frequencies (RF) typically need to be shielded from spurious RF signals that may interfere with the operation of the circuit. This is typically performed by placing a metal enclosure over the circuitry to prevent any unwanted RF signals from either entering or leaving the enclosure.

The problem with the conventional art is that if the circuit is trimmed or adjusted prior to attachment of the RF shield, the performance of the circuitry is changed once the shield is attached. This is due to the fact that subtle interactions between the circuit, the shield and the surrounding RF environment cannot be predicted prior to the attachment of the shield. Thus, even in the best of situations, the trimming process is an approximation rather than an exact tuning. Clearly, once the shield is attached, it is impossible to trim the resister or capacitor because it is underneath the shield and in accessible to the trimming beam.

Many inventors have attempted to solve this problem by creating small windows in the RF shield to allow, for example, a laser beam to trim the circuit However, in certain situations even these small openings will effect the performance of the circuit and thus precise trimming is not possible.

Clearly, a solution to this classical problem would be desirable, that is a method of trimming the circuit after the shield is attached to allow precise and accurate adjustment of the circuit. This solution would also preclude the use of apertures in the shield.

DETAILED DESCRIPTION OF THE PREFERRED EMBODIMENTS

Figure 1:
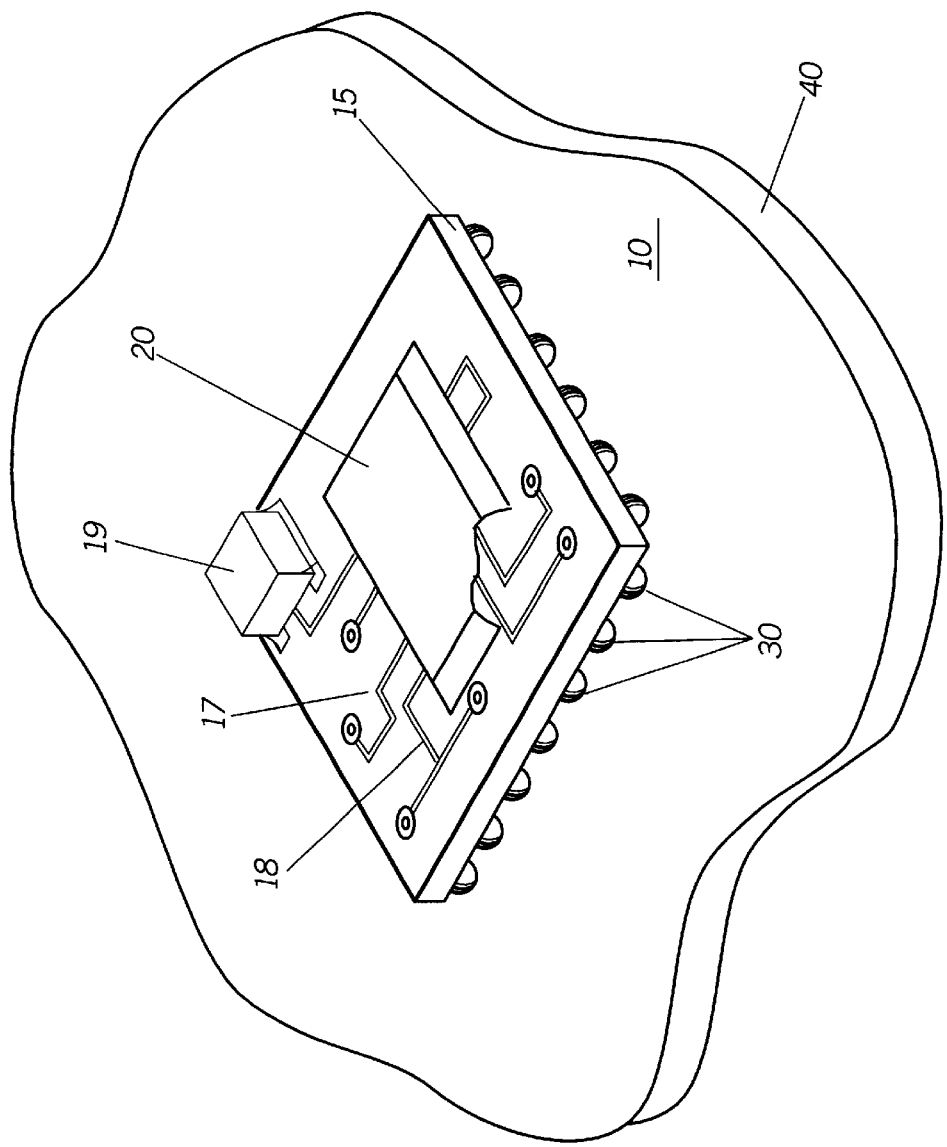
FIG. 1 is an isometric view of a hybrid circuit substrate in accordance with the invention.

A substrate has an electrically adjustable trim pad on the bottom side. A circuit pattern resides on the top side, covered by an RF shield. A trim pad is located on the bottom side directly below the RF shield, and is electrically connected to the circuit pattern. A number of surface mount connections, typically C5 solder bumps, are located on the bottom side, and surround the trim pad. The trim pad is trimmed after the RF shield is attached, thus providing more accurate tuning of the circuit on the top side.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, an isometric view of a circuit module contained on a substrate in accordance with the invention is shown. The module 10 contains a substrate 15 that has an electronic circuit 17 on the top side. This circuit 17 typically consists of a circuit pattern 18 and one or more discrete components 19 (such as resisters, capacitors, inductors, integrated circuits, transistors, etc., all well known to those skilled in the art). The module 10 also has a shield 20 that covers a portion or all of the circuit 17. To aid the reader is understanding the invention the drawing shows the shield 20 with one corner cut away to reveal the underlying circuitry. However, in practice, the shield typically need not contain any openings. On the bottom side of the module 10, is an array 30 or plurality of C5 solder attachments. The Controlled Collapse Chip Carrier Connection (C5) is well known in the industry and uses a plurality of precisely formed solder spheres to create the circuit interconnections between the module 10 and a mother board 40. Those skilled in the art will readily appreciate that the use of C5 spheres results in a highly controlled and uniform space being formed between the bottom of the module 10 and the top of the mother board 40. The C5 technology is renowned for its ability to control this gap while producing highly reliable solder joints.

Figure 2:
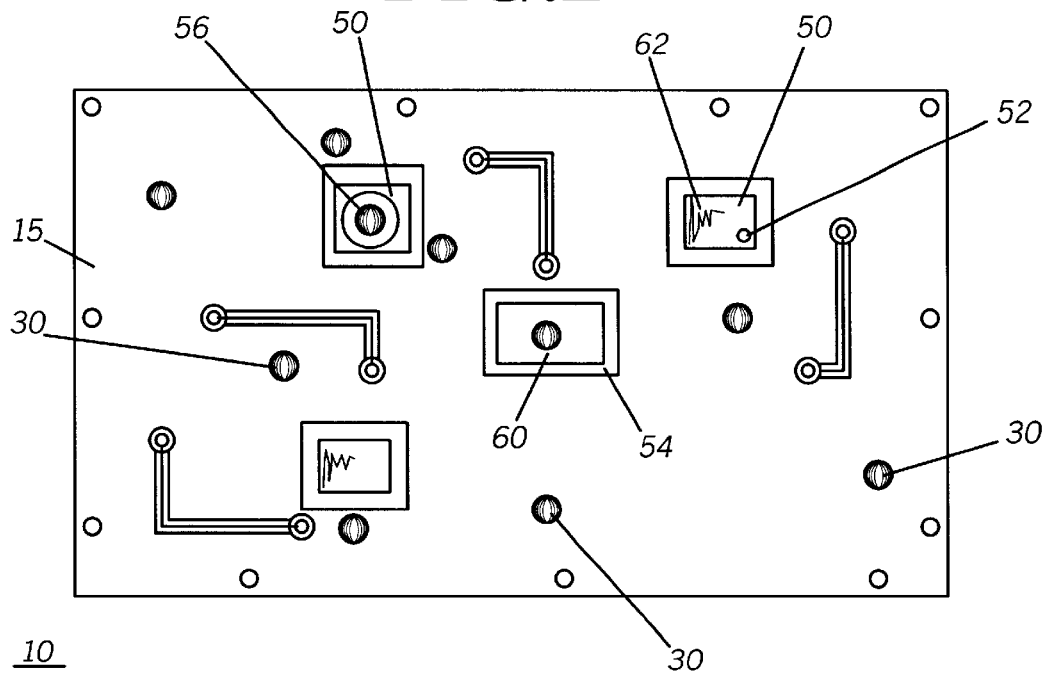
FIG. 2 is a plan view of the bottom side of a substrate in accordance with the invention.

Referring now to FIG. 2, a plan view of the bottom side of a preferred embodiment of the module 10 can be seen. The C5 attachments 30, are arranged in an array. Each of these C5 attachments consist of a solder sphere attached to an underlying pad on the substrate (not shown). Also on the bottom side of the substrate 15 is a trim pad 50. Trim pads are well known in the industry, but are heretofore only known to be located on the top side of the substrate in the prior art. The trim pad can be nearly any shape or size as desired by the circuit designer, and in the preferred embodiment, the trim pad located on the bottom side is surrounded by the C5 solder array. The trim pad 50 is connected to the circuitry on the top of the module by means of a via or plated through hole 52. In practice the trim pad is typically plated with gold or some other noble metal in order to control oxidation and thus the conductivity of the trim pad. In some cases the trim pad may have a surrounding area 54 that isolates the trim pad from other portions of the circuits such as the ground plane or adjacent C5 solder bumps.

Figure 3:
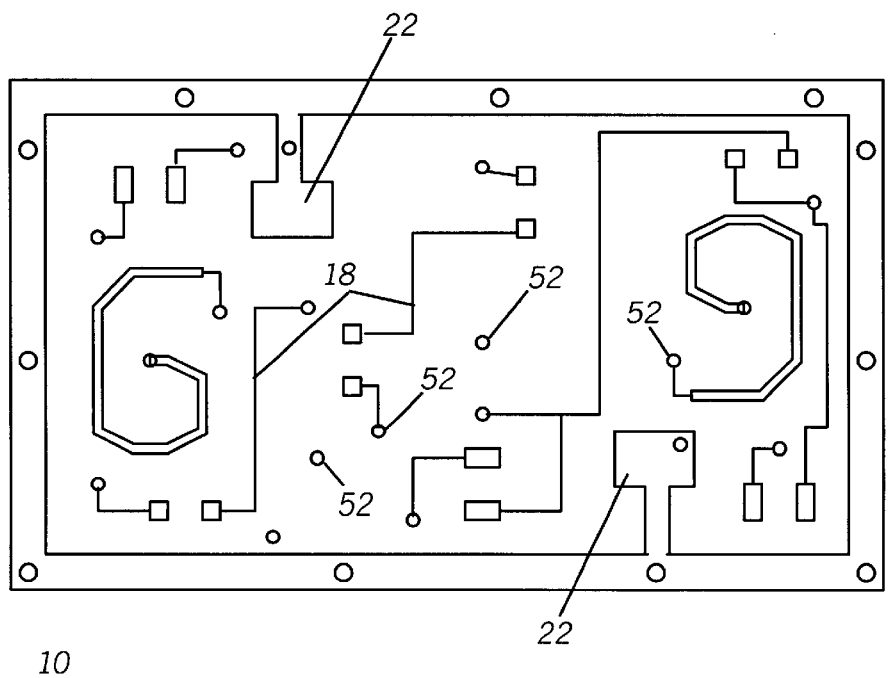
FIG. 3 is a plan view of the top side of a substrate in accordance with the invention.

The top side of a typical substrate, shown in FIG. 3, contains the circuit pattern 18 that has some portions 22 of the circuit pattern that lie directly above a trim pad. A plurality of plated through holes 52 also connect the circuit pattern 18 to the underlying trim pads. Depending on the exact nature of the circuit, the trim pad may or may not be directly connected by a plated through hole to the circuit pattern. Although not shown in this figure, the shield 20 typically covers at least a portion of the circuit pattern, and the trim pads are typically arranged to lie under the shadow of the shield on the bottom side.

The shield 20 is typically a metal shield and is used to prevent the incursion or escape of unwanted RF signals.

In a typical assembly sequence, the components 19 would be added to the substrate 15, and the shield 20 also added. After the shield 20 is attached to the module 10, the module is then trimmed by physically removing material from the trim pad 50. A number of means of removal of this material are possible, for example, sand trimming, mechanically milling portions, but more often one will find that the use of a laser such as an excimer laser or other type is used to precisely remove portions of trim pad. Methods of trimming and adjusting the trim pads are well known in the art.

An alternate embodiment of the invention shown in FIG. 2 allows a C5 solder bump to be placed directly on or within the parameter of the trim pad 50. In this instance, a non-metalized area 56, surrounds not only the trim pad but the C5 solder sphere that is located within the periphery of the trim pad. This allows one to significantly improve the density of the substrate by using area that would otherwise be unusable on the bottom of the substrate. As previously, the trim pad is connected to the circuitry by means of a via or plated through hole, however, the trim pad may also be connected to the remainder of the substrate by means of a C5 solder bump that is directly attached to it. In another embodiment, the C5 bump does not have a non-metalized area around it but is actually an integral part of the trim pad 60. In practice then, this allows one to trim a portion of the trim pad away by a laser resulting in a scribe mark 62 on the trim pad.

In summary, the instant invention provides a means of precisely trimming or adjusting an RF circuit containing a shield after the shield is attached. This obviates the need for openings or windows in the shield to do the trimming and allows the circuit to be more precisely tuned. The use of C5 solder spheres underneath the circuit provides a precisely controlled uniform space between the bottom of the circuit and the mother board. This is essential, since the trim pad is located on the bottom side of the module, and the distance between the trim pad and the mother board must be accurately and precisely controlled from unit to unit. In the prior art, methods such as solder printing would not allow one to create such a precisely maintained and uniform gap. The use of the C5 solder spheres in implementing a trim pad on the bottom of a module is essential. By precisely controlling this distance, the phenomena of "micro-phonics" is reduced or eliminated, because the C5 solder attachment results in a rugged and mechanically sound structure.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A C5 substrate having an electrically adjustable trim pad on a bottom side, comprising:

a substrate having a top side and a bottom side;

a circuit pattern on the top side;

a trim pad on the bottom side; and a plurality of surface mount connections on the bottom side, each comprising a C5 solder bump, at least one of the plurality of surface mount connections electrically connected to the circuit pattern on the top side.

2. The C5 substrate as described in claim 1, wherein a portion of the plurality of surface mount connections surround the trim pad.

3. The C5 substrate as described in claim 1, wherein one or more of the plurality of surface mount connections is located on the trim pad.

4. The C5 substrate as described in claim 1, wherein the trim pad is electrically connected to the circuit pattern.

5. The C5 substrate as described in claim 1, further comprising a mother board, the C5 substrate soldered to the mother board by means of the C5 solder bumps.

6. The C5 substrate as described in claim 1, further comprising a plurality of trim pads located on the bottom side.

7. The C5 substrate as described in claim 1, further comprising an RF shield on the top side, the RF shield covering at least a portion of the circuit pattern.

8. The C5 substrate as described in claim 1, wherein a portion of the trim pad has been removed.

9. The C5 substrate as described in claim 8, wherein said removed portion is removed after the RF shield is attached.

10. The C5 substrate as described in claim 8, wherein said removed portion is removed by a laser.

11. A module having an electrically adjustable trim pad on a bottom side, comprising:

a substrate having a top side and a bottom side;

a circuit pattern on the top side;

an RF shield attached to the top side, the RF shield covering at least a portion of the circuit pattern;

a trim pad on the bottom side, electrically connected to the circuit pattern, the trim pad located directly below the RF shield;

a plurality of surface mount connections on the bottom side, each comprising a C5 solder bump, at least one of the plurality of surface mount connections electrically connected to the circuit pattern on the top side; and at least a portion of the plurality of surface mount connections surrounding the trim pad.

12. The module as described in claim 11, wherein a portion of the trim pad has been removed.

13. The module as described in claim 12, wherein said removed portion is removed by a laser.

14. The module as described in claim 12, wherein said removed portion is removed after the RF shield is attached.

15. The module as described in claim 11, further comprising a mother board, the substrate is soldered to the mother board by means of the C5 solder bumps.

* * * * *